(12) United States Patent
Langlais et al.

(10) Patent No.: US 9,059,877 B2
(45) Date of Patent: Jun. 16, 2015

(54) DYNAMIC GAIN FOR DAC ILLUMINATION CONTROL

(71) Applicant: QUALCOMM Incorporated, San Diego, CA (US)

(72) Inventors: Brian James Langlais, Almonte (CA); Joubin Karimi, Ottawa (CA); Ehab Tahir, Mississauga (CA); Gregory Allen Magin, Ocala, FL (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/167,969

(22) Filed: Jan. 29, 2014

(65) Prior Publication Data

US 2014/0355712 A1  Dec. 4, 2014

Related U.S. Application Data

(60) Provisional application No. 61/829,998, filed on May 31, 2013.

(51) Int. Cl.
*H04B 7/00* (2006.01)
*H04L 25/02* (2006.01)
*H03G 3/30* (2006.01)

(52) U.S. Cl.
CPC .............. *H04L 25/02* (2013.01); *H03G 3/3042* (2013.01)

(58) Field of Classification Search
CPC ........ H04B 1/04; H04B 1/0458; H04B 25/10; H04B 25/12
USPC ................................................. 375/296, 297
See application file for complete search history.

(56) References Cited

U.S. PATENT DOCUMENTS

| 7,809,393 | B2 * | 10/2010 | Runze et al. ................... 455/522 |
| 8,384,476 | B2 | 2/2013 | Draxler et al. |
| 8,428,181 | B2 | 4/2013 | Chan et al. |
| 8,451,960 | B2 | 5/2013 | Rozenblit et al. |
| 8,565,343 | B1 * | 10/2013 | Husted et al. ................. 375/297 |
| 2005/0206447 | A1 | 9/2005 | Yamazaki et al. |
| 2008/0232436 | A1 | 9/2008 | Schwartz et al. |
| 2009/0207896 | A1 | 8/2009 | Behzad |

FOREIGN PATENT DOCUMENTS

| EP | 2582038 A1 | 4/2013 |
| WO | 2014194170 | 12/2014 |

OTHER PUBLICATIONS

"PCT Application No. PCT/US2014/040167 International Search Report and Written Opinion", Sep. 2, 2014, 10 pages.

* cited by examiner

*Primary Examiner* — Kevin Kim
(74) *Attorney, Agent, or Firm* — DeLizio Law, PLLC (57) ABSTRACT

A transmitting device may control digital-to-analog converter (DAC) illumination to optimize signal to noise ratio of a transmission signal. DAC illumination may be adjusted based, at least in part, on analog gain and estimated total transmit power of a particular transmission signal. For each destination, total transmit power may be estimated based on tone map, amplitude map, back-off settings, or other characteristics. The estimated total transmit power is used to determine an appropriate analog gain. Once analog gain and total transmit power are known, fine control of SNR may be achieved by adjusting power level in the digital domain. A digital power control setting is used to scale the amplitude of the digital baseband signal prior to DAC operation. The DAC illumination of the digital baseband signal allows the DAC to operate at an optimized power level within the digital range of the DAC.

27 Claims, 8 Drawing Sheets

DYNAMIC GAIN FOR DAC ILLUMINATION CONTROL

RELATED APPLICATIONS

This application claims the priority benefit of U.S. Provisional Application Ser. No. 61/829,998 filed May 31, 2013.

BACKGROUND

Embodiments of the inventive subject matter generally relate to the field of communication systems, and, more particularly, to adjusting gain of a transmission signal in view of digital to analog converter (DAC) illumination.

A transmitter of a communication device may include a variety of components, referred to as a transmit chain. Several components of a transmit chain can amplify a transmission signal to produce a desired output power. For example, the transmitter may use analog amplifiers to boost the transmission signal. An amplified transmission signal may result in a higher quality signal (e.g., a signal with high signal-to-noise ratio, SNR). Higher SNR may be especially useful for data frames that are composed of high levels of quadrature amplitude modulation (QAM). However, amplifying the analog signal may enhance quantization error or other imperfections of the analog signal.

In a transmitter of a communication device, source signals in the form of a digital baseband signal may be converted to an analog signal at a digital-to-analog converter (DAC). The power of the digital baseband signal may impact the DAC illumination (sometimes referred to as an "operating point" of the DAC). DAC illumination refers to an amount of amplitude scaling (or amplification of the signal power level) of a digital input signal going into a DAC. The digital input signal is "illuminated" to increase the amplitude of the signal power in the digital domain, such that the DAC operates on the digital input signal at a particular average amplitude level. In other words, a digital input signal will be digitally amplified ("illuminated") so that the power range of the digital input signal improves the digital-to-analog conversion of the digital input signal to an analog output signal. The DAC illumination (and the DAC operating level) may be referenced by a root mean square amplitude level of the digital input signal. The root mean square amplitude can be estimated as the standard deviation of a signal packet which may have a zero mean value.

A DAC typically has an optimal DAC illumination based on the design of the transmitter circuitry. For example, a fully utilized DAC should receive a source signal such that each of the DAC input bits contributes to the output at the DAC. However, operating a DAC at a maximum of the digital range of the DAC (e.g., maximum DAC illumination) may introduce signal clipping in the event of a burst of digital data. Signal clipping may cause the signal SNR to drop rapidly if signal amplitude is increased, may cause spectral distortion of the transmitter output, or may cause a reduction in notching capabilities of the transmitter. Conversely, operating a DAC with signals at a low level of the digital range of the DAC (e.g., low DAC illumination) may be an inefficient use of the DAC and signal resources. Furthermore, DAC illumination may be too low, which may not provide a sufficient signal-to-noise ratio due to quantization noise.

SUMMARY

Various embodiments are disclosed which include controlling DAC illumination based, at least in part, on analog gain and estimated total transmit power of a particular transmission signal. The DAC illumination may be controlled so that the digital signal is within a target range within the DAC operating range to optimize signal-to-noise ratio of the transmitter output.

In one embodiment, an analog amplifier is configured based, at least in part, on an estimated power spectral density of a transmission signal. The analog amplifier is positioned to amplify an analog output signal of a digital-to-analog converter (DAC) and produce the transmission signal. A digital amplifier is positioned to digitally scale a data signal and produce a digital input signal of the DAC. A power control setting of the digital amplifier is adjusted based, at least in part, on a target average amplitude of the digital input signal. The data signal is transmitted via the digital amplifier, DAC, and analog amplifier, such that the transmission signal approximates the estimated power spectral density.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, while examples refer to controlling illumination of a DAC in a single transmit chain, the concepts described herein are applicable to controlling the illumination of DACs in multiple transmit chains of the transmitter. In other instances, well-known instruction instances, protocols, structures and techniques have not been shown in detail in order not to obfuscate the description.

To improve SNR of a transmitted signal, gain settings can be adjusted for both a digital amplifier and an analog amplifier (e.g., analog front end (AFE) amplifier) in a transmitter. The digital amplifier precedes the DAC in a transmit chain of the transmitter. The digital amplifier may be configured to digitally scale (amplify) the amplitude of the data signal. The gain provided by the digital amplifier may be adjusted using a digital power control setting. DAC illumination may be controlled based on an amount of gain provided by the digital amplifier. An AFE amplifier is cascaded after the DAC in the transmit chain of the transmitter. The gain of the AFE amplifier may be controlled using analog gain setting.

In accordance with this disclosure, the analog gain setting and the digital power control setting may be determined such that a transmitter can operate the DAC with optimal DAC illumination while also producing an output signal having the desired SNR. The desired SNR may be associated with a total transmit power (e.g., a sum of the power spectral densities for each used carrier) at the output of the transmitter. The digital power control setting may be adjusted to control the DAC illumination. In one embodiment, a DAC illumination control module may determine the analog gain setting prior to determining the digital power control setting. The analog gain setting may be used to achieve the desired power output while the digital power control setting may be determined based at least in part on DAC illumination considerations, such as quantization, optimal operating range, clipping thresholds, or the like.

Figure 1:
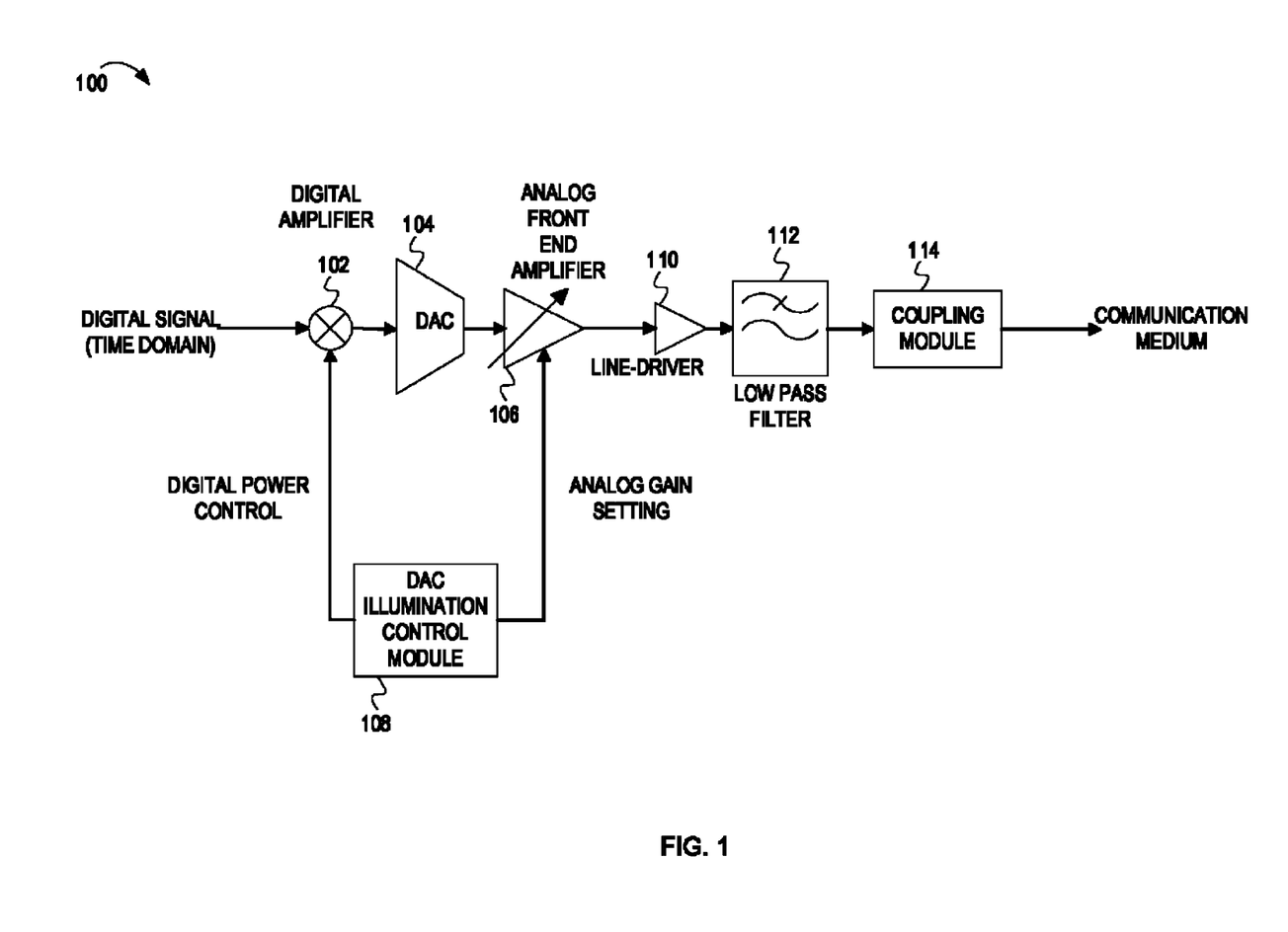
FIG. 1 is an example system diagram of a portion of a transmitter in accordance with one embodiment of this disclosure.

FIG. 1 illustrates an example system diagram of a portion of a transmitter 100. The transmitter 100 includes a digital amplifier 102 (e.g., a class D amplifier) communicatively coupled to a DAC 104 (e.g., a pulse width modulator, an R-2R DAC etc.). The DAC 104 is communicatively coupled to an AFE amplifier 106 which is an analog amplifier (e.g., an operational amplifier). The AFE amplifier 106 is communicatively coupled to a line-driver 110 (e.g., a line amplifier, etc.). The line-driver 110 is communicatively coupled to a low-pass filter 112 (e.g., a Butterworth filter, a Chebyshev filter, etc.). The low-pass filter 112 is communicatively coupled to a coupling module 114 (e.g., a powerline coupler, etc.) which is coupled to a communication medium. It should be understood that other transmitter chains may include more components or fewer components than the example in FIG. 1. For example, a multiple input multiple output (MIMO) transmitter may include multiple transmit chains, each transmit chain having a separate digital amplifier 102, DAC 104, AFE amplifier 106, and other transmitter components.

The digital amplifier 102 may also be referred to as a multiplier or variable gain pre-amplifier in some diagrams. In FIG. 1, the digital amplifier 102 receives a digital power control setting from a DAC illumination control module 108. The AFE amplifier 106 receives an analog gain setting from the DAC illumination control module 108. The digital power control setting and the analog gain setting may be scalar values to indicate gains of the digital amplifier 102 and the AFE amplifier 106, respectively. For example, the analog gain setting may be a value from 0-15, each value representing a gain step size (e.g., 2 dB gain per step). The digital power control setting may be associated with a different scale and usage. For example, the digital power control setting may be a value from 0-2047, each value representing a multiplier value to multiply with a source data signal. In some implementations, the analog gain setting may be associated with coarse-level control of the transmitter amplification capability, while the digital power control may provide fine-level control of the transmitter amplification capability.

The digital amplifier 102 receives a digital data signal in time-domain (e.g., a 12 bit digital signal) and amplifies the digital data signal based on a value of the digital power control setting. For example, the digital amplifier 102 may scale the amplitude of the digital data signal by a factor equal to the value of the digital power control setting. The digital amplifier 102 provides the amplified digital data signal to the DAC 104. The amplified digital data signal may be referred to as a digital input signal of the DAC 104. The DAC 104 converts the digital input signal received from the digital amplifier 102 into an analog output signal (e.g., using pulse density modulation). For example, the DAC 104 may be a DAC with 12 bit resolution and constructs the analog output signal from the digital input signal. The DAC 104 provides the analog output signal to the AFE amplifier 106.

The AFE amplifier 106 may amplify the analog signal using an analog gain setting received from the DAC illumination control module 108. For example, the AFE amplifier 106 may amplify the power of the analog signal by a factor equal to the analog gain setting. The AFE amplifier 106 couples the amplified analog signal to the line driver 110. The line driver 110 may boost the amplified analog signal for transmission on a transmission line (e.g., a powerline, coaxial cable, etc.) and couples the analog signal to the low-pass filter 112. The low-pass filter 112 can restrict the frequencies of the signal within the frequencies of a communication system (e.g., a powerline communication system) and couple the signal to the coupling module 114. The coupling module 114 can couple the signal to the communication medium. For example, in case of powerline communication, the coupling module 114 may include a coupling transformer to couple the signal on a powerline.

In accordance with an embodiment of this disclosure, the DAC illumination control module 108 determines the values of digital power control setting and analog gain setting. In one implementation, the DAC illumination control module 108 may first determine an estimate of the total transmit power (which may be referred to as total output power) based upon an estimated power spectral density for each of the tones (i.e., frequency carriers) used for a particular transmission. The tones used for the particular transmission may be determined from a tone map. The estimated power spectral density may be adjusted based upon an amplitude map, back-off setting, or other transmission characteristics that impact the estimated power spectral density of various tones. The DAC illumination control module 108 may then determine a total transmit power expected for the particular transmission based, at least in part, on a sum of the power spectral densities of some or all the tones. Using the estimated total transmit power, the DAC illumination control module 108 may determine a value of root mean square voltage at the output of the transmitter.

Root mean square (RMS) voltage refers to the amount of power that a sinusoidal signal is capable of providing, calculated as a square root of the mean of the squared voltages of a plurality of samples. RMS output voltage of the transmitter refers to the power of the transmission signal. For example, the DAC illumination control module 108 can determine the RMS voltage at the output of transmitter using the total transmit power and the impedance of the communication medium. The analog gain setting can be determined as the gain of the AFE amplifier that would produce the RMS output voltage based upon a power of the analog signal prior to the AFE amplifier. The DAC illumination control module 108 can determine the value of AFE gain control by computing the ratio of root mean square voltage at the output of the transmitter with the root mean square voltage that the DAC 104 can output.

Because the analog gain setting is a coarse-level step value (e.g., representing steps of 2 dB), the analog gain may not be precise. The estimated expected analog gain based upon the analog gain setting may be computed by the DAC illumination control module 108. The DAC illumination control module 108 may determine the target RMS voltage of the analog output signal from the DAC to the AFE amplifier that would produce the RMS output voltage based upon the estimated expected analog gain of the AFE amplifier. In one implementation of this disclosure, the transmitter is designed with a target voltage of the analog output signal from the DAC to the AFE amplifier. The target RMS voltage of the analog output signal from the DAC may be used by the DAC illumination control module 108 to determine the digital power control setting. The digital power control setting may be determined based on a target RMS voltage of the analog output signal from the DAC. The digital power control setting may represent the amplitude scaling used to amplify a digital time domain signal input to the DAC such that the output of the DAC is within a threshold range of the target RMS voltage. For example, in one implementation, the digital power control setting may be based, at least in part, on a ratio of the target RMS voltage of the analog output signal of the DAC over the average power level of the digital input signal prior to digital amplification. In another implementation, the digital power control setting may be based on a lookup table based upon one or more of the total transmit power, expected analog gain, or the analog gain setting. In another implementation, the digital power control setting may be based on a calculation using the total transmit power and a fixed estimate of an optimal DAC illumination.

In some implementations, the DAC illumination control module 108 may determine the value of digital power control such that the signal output by the digital amplifier 102 results in a desired illumination power at the DAC 104 and for the power at the output of the DAC 104 to be within a desired range. To determine the digital power control setting, the DAC illumination control module 108 may determine an estimate of a target RMS voltage at the output of the DAC 104 using the estimate of the power at the output of the DAC 104. The DAC illumination control module 108 can then determine the digital power control value as the gain of the digital amplifier 102 using the target RMS voltage and the amplitude of the digital signal input to the digital amplifier 102.

Figure 2:
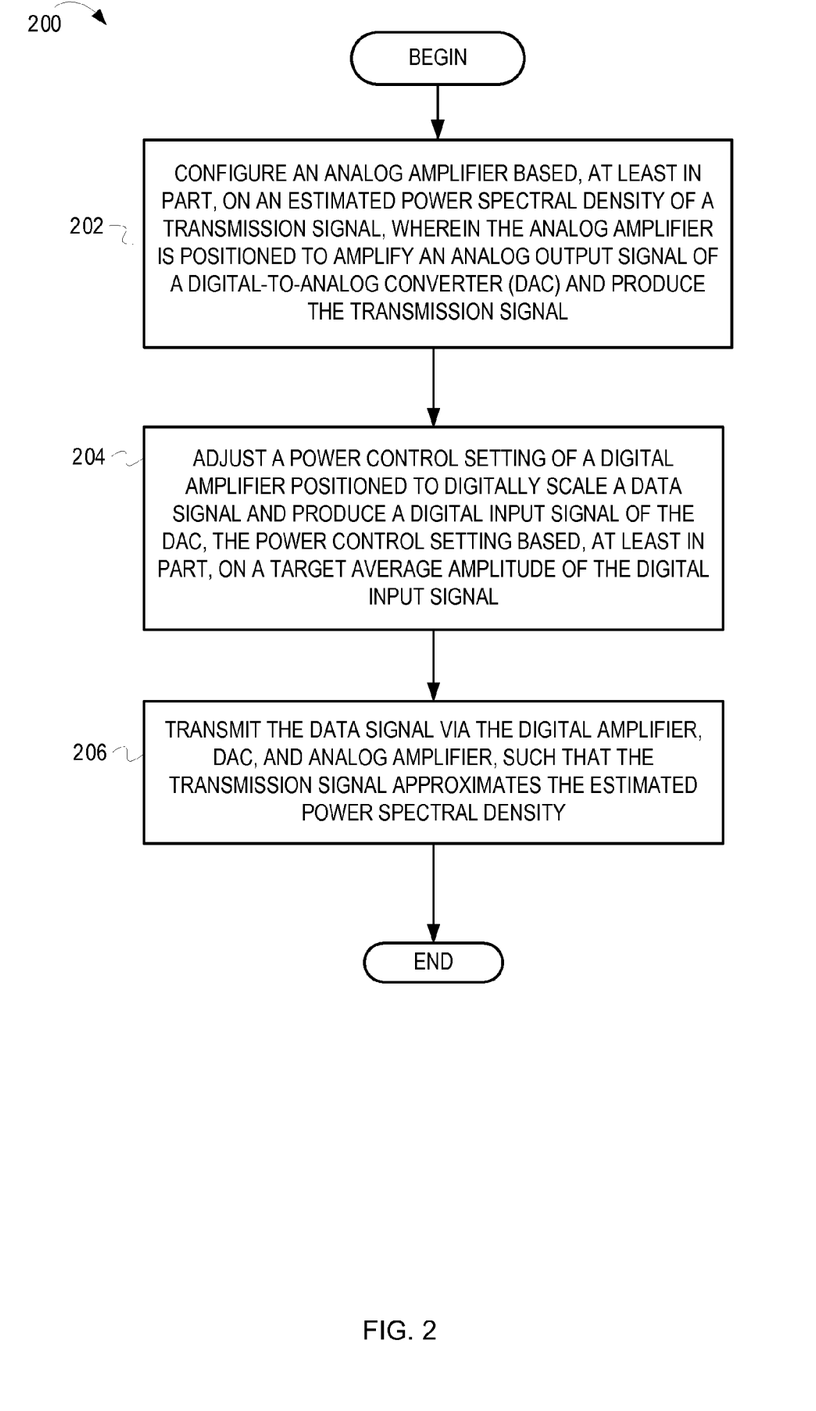
FIG. 2 is an example flow diagram to configure a digital amplifier and an analog amplifier in accordance with one embodiment of this disclosure.

FIG. 2 illustrates a flow diagram of example operations to configure a digital amplifier and an AFE amplifier in a transmitter section to transmit a signal with desired signal quality in accordance with an embodiment of the present disclosure.

At block 202, an analog amplifier is configured, at least in part, on an estimated power spectral density of a transmission signal, wherein the analog amplifier is positioned to amplify an analog output signal of a digital-to-analog converter (DAC) and produce the transmission signal. In one implementation, the DAC illumination control module 108 as described above with reference to FIG. 1 configures an analog amplifier (e.g., the AFE gain control amplifier 106) with an AFE gain control value. The DAC illumination control module 108 determines the value of the analog gain setting based on an estimated power spectral density. For example, the DAC illumination control module 108 may compute the total transmit power based on the power spectral density and based on the output power that a particular DAC (e.g., the DAC 104) can produce. The DAC illumination control module 108 may determine the AFE gain control value and configures the AFE amplifier 106.

At block 204, power control settings of a digital amplifier are adjusted, wherein the digital amplifier is positioned to digitally scale a data signal and produce a digital input signal of the DAC, the power control setting based, at least in part, on a target average amplitude of the digital input signal. In one implementation, the DAC illumination control module 108 determines an amplitude control setting of the digital amplifier (e.g., the digital power control value for the digital amplifier 102). For example, the DAC illumination control module 108 determines the digital power control such that the output at the DAC 104 is equal to an estimated value of the target RMS voltage of the analog output signal. The DAC illumination control module 108 may send the digital power control setting to the digital amplifier 102 which scales the amplitude of the input digital signal by a factor of the digital power control value.

At block 206, the data signal is transmitted via the digital amplifier, DAC, and analog amplifier, such that the transmission signal approximates the estimated power spectral density. In one implementation, the data signal is transmitted from the transmitter section 100 which includes the digital amplifier 102, the DAC 104, and the AFE amplifier 106. For example, the data signal is coupled from the coupling module 114 for transmission on the communication medium. Based on the amplification by the digital power amplifier 102 and the AFE amplifier 106, the signal coupled to the transmission medium has an SNR which is approximately equal to the target SNR based on which the values of digital power control and the AFE gain control were computed by the DAC illumination control module 108.

Figure 3:
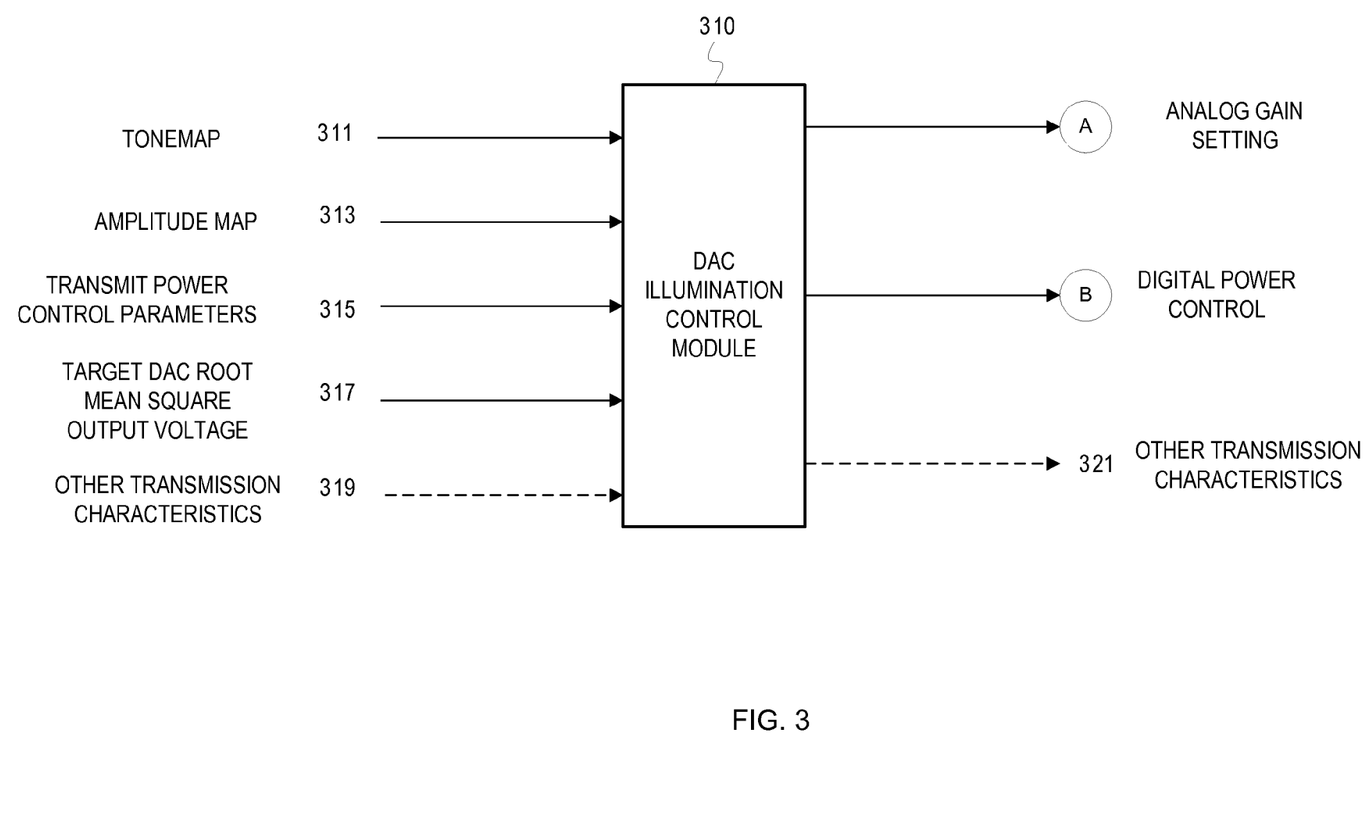
FIG. 3 is an example system diagram of a DAC illumination control module in accordance with one embodiment of this disclosure.

FIG. 3 is an illustration of a DAC illumination control module in accordance with an embodiment of the present disclosure. FIG. 3 includes a DAC illumination control module 310. The DAC illumination control module 310 is similar to the DAC illumination control module 108 and performs similar functions, as described above with reference to FIG. 1. FIG. 3 illustrates example input parameters and output parameters of the DAC illumination control module 310. In some embodiments of this disclosure, the DAC illumination control module may be implemented at a media access control (MAC) layer of a transmitter. The DAC illumination control module may send the analog gain setting and digital power control setting to a physical (PHY) layer of the transmitter.

The input parameters to the DAC illumination control module 310 may include a tone map 311, an amplitude map 313, transmit power control parameters 315, a target DAC root mean square output voltage 317, and other transmission characteristics 319. The target DAC RMS output voltage typically scales to a particular DAC input RMS amplitude governed by DAC bit resolution and output total voltage range that tracks the DAC bit resolution. The tone map 311 includes information about data carried by each of the frequency carriers in a communication signal. For example, for an orthogonal frequency division multiplexing (OFDM) signal, the tone map 311 may include information about number of bits per OFDM carrier for the communication signal. The tone map 311 may also include information about which carriers are used in the communication signal and which carriers are not used. The amplitude map 313 may include information about the amplitude values of the carriers in the communication signal. For example, the amplitude map 313 may include amplitudes of the discrete values of the communication signal. The amplitude map 313 may also include corrections to tune one or more AFE coupler filters for optimum performance. The DAC illumination control module 310 can take into account characteristics of an AFE filter when determining the analog gain setting and the digital power control setting.

The transmit power control parameters 315 may include parameters that influence the output power from the transmitter subsection. For example, the transmit power control parameters may include pulse-shaping information for multiple input multiple output (MIMO) or single input single output (SISO) transmission, power back-off information, analog pre-distortion, and coupler roll-off etc. The power back-off information may include the frequency carriers at which power is to be reduced or turned off. For example, in a powerline communication system, power at certain frequency carriers may need to be reduced to minimize interference, etc. The transmitter power control parameters 315 may also include the power spectral density of the communication signal to be coupled to a communication medium. The DAC illumination control module 310 may also receive a target DAC root mean square illumination value which could vary for different transmission modes. For example, the target DAC root mean square illumination value may be a constant based on a particular implementation of the DAC illumination control module 310. The other transmission characteristics 319 received by the DAC illumination control module 310 may include one or more parameters which may be fixed or variable based on the implementation of the DAC illumination control module 310. For example, the parameters can include a sampling frequency, a size of FFT/IFFT engine, gain step size of an AFE amplifier, peak-to-peak voltage at the output of a DAC, resolution of the DAC (i.e., number of bits), impedance of the communication medium, etc.

The output parameters of the DAC illumination control module 310 may include an analog gain setting ("A"), a digital power control setting ("B"), and other transmission characteristics 321. In one implementation, the AFE gain control value is fed into the AFE amplifier (e.g., the AFE amplifier 106 in FIG. 1), and the digital power control value is fed into the digital amplifier (e.g., the digital amplifier 102 in FIG. 1). The output parameters of the DAC illumination control module 310 may also include other transmission characteristics which may be fed into one or more components of the transmitter. In some implementations, the other transmission characteristics at the output of the DAC illumination control module 310 may include percentage errors in calculation for the values of the AFE gain control and the digital power control. The percentage error in for the value of AFE gain control may be utilized by the AFE amplifier 106 to fine tune the value of the AFE gain control for utilization, and the percentage error for the value of the digital gain control may be utilized by the digital amplifier 102 to fine tune the value of the digital gain control for utilization.

In one implementation, the DAC illumination control module 310 computes the power at the output of the DAC (e.g., the DAC 104) based on the capabilities of the DAC 104 and other parameters. For example, the DAC illumination control module 310 computes the power based on the peak-to-peak voltage at the output of the DAC 104, the target DAC root mean square output voltage 317, the resolution of the DAC 104 and the impedance of a communication medium. The DAC illumination control module 310 then determines a power spectral density array of transmission power for a set of carriers based on the amplitude map 313 and the tone map 311. The DAC illumination control module 310 computes a sum of the values in the power spectral density array as a total transmit power. The DAC illumination control module 310 then determines an initial value of the AFE gain control for achieving the total transmit power. The DAC illumination control module 310 determines the initial value of the AFE gain control based on the ratio of the total transmit power and the power at the output of the DAC 104. The DAC illumination control module 310 may then determine a final value of the AFE gain control taking into account the step size of the AFE 106. For example, the DAC illumination control module 310 determines the final value of the AFE gain control by performing iteration of a loop where the maximum number of iterations that the DAC illumination control module 310 may perform is equal to the number of gain steps for the full range of the AFE amplifier 106. The DAC illumination control module 310 determines the gain step number of the AFE amplifier 106 using which the total transmit power can be achieved as the final value of the AFE gain control. It is noted that the final value of the AFE gain control to achieve the total transmit power is an estimated value as the AFE amplifier 106 can perform amplification in steps (e.g., in steps of 2 dB). The DAC illumination control module 310 can utilize the final value of the AFE gain control to determine an estimate of the power from the DAC 104 to achieve the total transmit power.

In some implementations, the DAC illumination control module 310 can determine a target root mean square illumination for the DAC 104 to achieve the total transmit power. The DAC illumination control module 310 can then determine an estimated root mean square illumination value taking into account power control characteristics (e.g., power back-off, etc.). The DAC illumination control module 310 can determine the value of digital power control value by utilizing the values of the target root mean square illumination, the estimated root mean square illumination and one or more constants based on the implementation of the DAC 104.

It is noted that in some implementations, the DAC illumination control module 310 can utilize the estimate of the power from the DAC 104 (i.e., the estimate computed using the final value of the AFE gain control) to determine a target output voltage (e.g., target a root mean square voltage value). The DAC illumination control module 310 can then determine the digital power control value as the gain of the digital amplifier 102 using the target output voltage and the amplitude of the digital signal input to the digital amplifier 102.

In some implementations, the DAC illumination control module 310 can determine the values of the AFE gain control and the digital power control for the transmitter on per packet basis or a per destination basis. For example, if a first packet is to be sent from the transmitter to a first network device and a second packet is to be sent to a second network device, the DAC illumination control module 310 can determine the AFE gain control value and the digital power control value for each the first packet and the second packet respectively. In some implementations, some of the transmission characteristics and power requirements at the output of the transmitter may change at short durations (e.g., few seconds). Furthermore, the tone map and amplitude map may be different for each destination of the first packet and the second packet. The DAC illumination control module 310 can determine the values of the AFE gain control and the digital power control based on such variations.

It is noted that in some embodiments, the DAC illumination control module 310 may determine the value of digital power control is less than unity gain. For example, if the amplitude of the digital signal is high enough to result in signal clipping at the DAC 104, the DAC illumination control module 310 may determine the value of digital power control which would result in less than unity gain. It is further noted that, for MIMO systems the DAC illumination control module 310 may be separately utilized to determine the value of digital power control and AFE gain control for each of the chains. However, if the pulse shaping is similar for each of the transmit chains in a MIMO transmitter, the DAC illumination control module 310 may determine the values of digital power control and AFE gain control for both of the chains.

Figure 4:
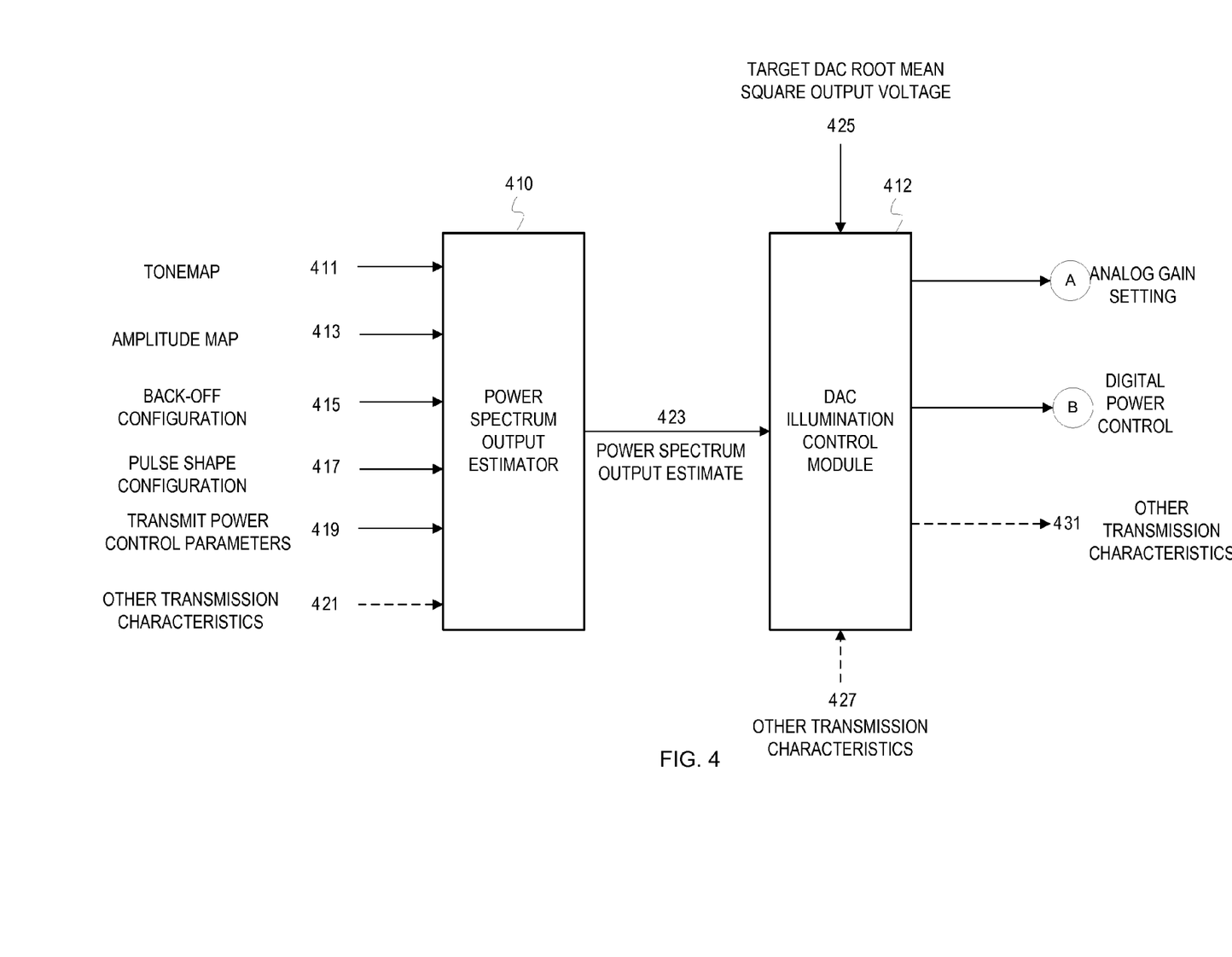
FIG. 4 is another example system diagram of a DAC illumination control module in accordance with one embodiment of this disclosure.

FIG. 4 is an illustration of a DAC illumination control module in accordance with an embodiment of the present disclosure. FIG. 4 includes a DAC illumination control module 412 and a power spectrum output estimator 410. The DAC illumination control module 412 may be similar to the DAC illumination control module 108 as described above with reference to FIG. 1 except that operations to determine the total transmit power may be performed by the power spectrum output estimator 410 rather than the DAC illumination control module 412. In some transmitters, a power spectrum output estimator 410 may already exist to determine the total transmit power based on a variety of factors. Alternatively, the power spectrum output estimator 410 may be embodied separately from the DAC illumination control module 412, so that the power spectrum output estimator 410 may be used for other subsystems of the transmitter.

In one implementation, the DAC illumination control module 412 and the power spectrum output estimator 410 together perform the functions of the DAC illumination control module 108 and perform similar functions, as the functions of the DAC illumination control module 310 as described above with reference to FIG. 3. FIG. 4 illustrates example input parameters and output parameters of the power spectrum output estimator 410 and the DAC illumination control module 412.

The power spectrum output estimator 410 can determine power spectrum output estimates 423 of the communication signal to be transmitted. For example, the power spectrum output estimates 423 may include a total transmit power. The power spectrum output estimates 423 may be utilized by the DAC illumination control module 412 to determine the values of AFE gain control and digital power control (as will be further described below). The power spectrum output estimator 410 can determine the power spectrum output estimates of the communication signal based on input parameters which include a tone map 411, an amplitude map 413, a back-off configuration 415, a pulse shape configuration 417, transmit power control parameters 419, or other transmission characteristics 421. The input parameters may include all or a subset of those described above in FIG. 3.

The power spectrum output estimator 410 can determine a power spectral density array of transmission power values for a set of carriers. The power spectrum output estimator 410 can then determine the total transmit power as a sum of values in the power spectral density (PSD) array. The power spectrum output estimator 410 can take into account the pulse shape configuration 417 for SISO/MIMO systems and the back-off configuration information 415 (e.g., reduction in power for certain carriers) while determining the power spectrum output estimate 423. It is noted that the power spectrum output estimator 410 may be utilized to reduce the complexity of implementation of a DAC illumination control module.

The DAC illumination control module 412 receives a target root mean square output voltage 425, the power spectral output estimate 423, and other transmission characteristics 427 (as described above with reference to FIG. 3). The DAC illumination control module 412 performs similar functions as the DAC illumination control module 310, except that the DAC illumination control module 412 may not compute the total transmit power. The DAC illumination control module 412 can determine an analog gain setting ("A"), a digital power control setting ("B"), and other transmission characteristics 431 (similarly as described for the DAC illumination control module 310 in FIG. 3). The DAC illumination control module 412 can send the value of AFE gain control to the AFE amplifier 106, and the value of the digital power control to the digital amplifier 102.

Figure 5:
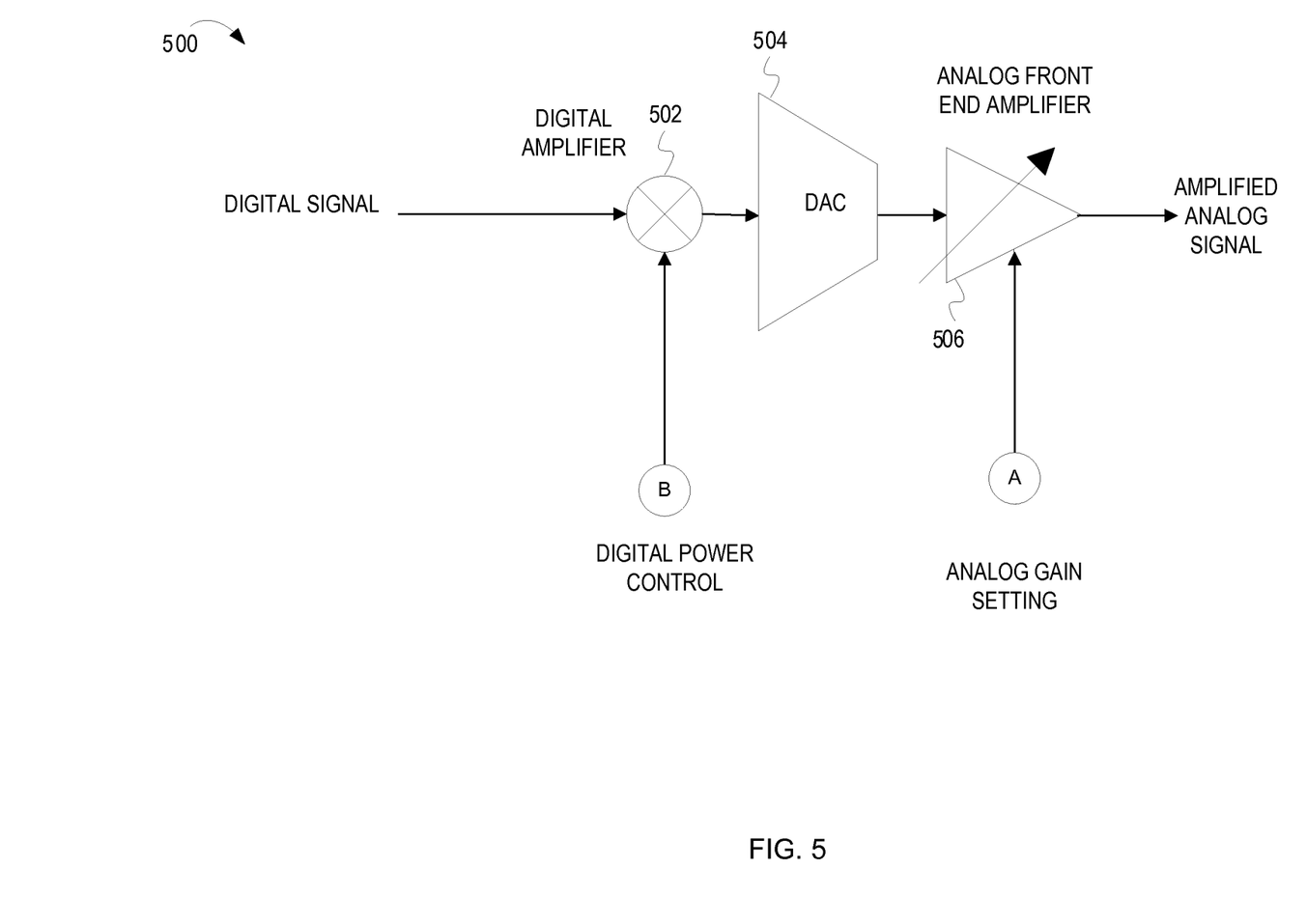
FIG. 5 is an example of a physical layer portion of a transmitter receiving digital power control and analog gain settings in accordance with one embodiment of this disclosure.

FIG. 5 illustrates an example diagram of a transmitter section receiving digital power control and AFE gain control values from a DAC illumination control module. FIG. 5 is an illustration of a portion of a transmitter 500 at a physical (PHY) layer. The portion of the transmitter 500 includes a digital amplifier 502, a DAC 504, and an AFE amplifier 506. The digital amplifier 502, the DAC 504, and the AFE amplifier 506 are similar to the digital amplifier 102, the DAC 104, and the AFE amplifier 106 and perform similar functions. The digital amplifier 502 receives the digital power control setting ("B"), and the analog gain setting ("A") from the DAC illumination control module (e.g., the DAC illumination control module 310 as described above in FIG. 3 or the DAC illumination control module 412 as described above in FIG. 4).

On receiving the digital power control setting ("B"), the digital amplifier 502 scales the amplitude of the digital signal input into the amplifier 502 by a factor equal to the digital power control setting or by a factor associated with the value of the digital power control setting. In an implementation, the digital amplifier may scale the input digital signal across its entire frequency spectrum. For example, the digital amplifier 502 may be a variable gain amplifier that multiplies each of the discrete values in the digital signal with the digital power control setting ("B"). The resultant signal from the digital amplifier 502 is an output signal with lower peak-to-average ratio and which can illuminate the DAC 504 to ensure a high signal quality (e.g., higher SNR) at the output of the DAC 504. The DAC constructs an analog signal from the digital signal received from the digital amplifier 502 and couples the analog signal to the AFE amplifier 506.

On receiving the analog signal from the DAC 504, the AFE amplifier 506 amplifies the analog signal based on the analog gain setting ("A") received from the DAC illumination control module (i.e., the DAC illumination control module 310 or the DAC illumination control module 412). The AFE amplifier 506 scales the power of the analog signal received from the DAC 504 and ensures that the transmit power at the output of the transmitter section is in accordance within a desired range. It is noted that the AFE gain control value (A) is an estimated value determined by the DAC illumination control module to scale up the power up to the desired power level.

Figure 6:
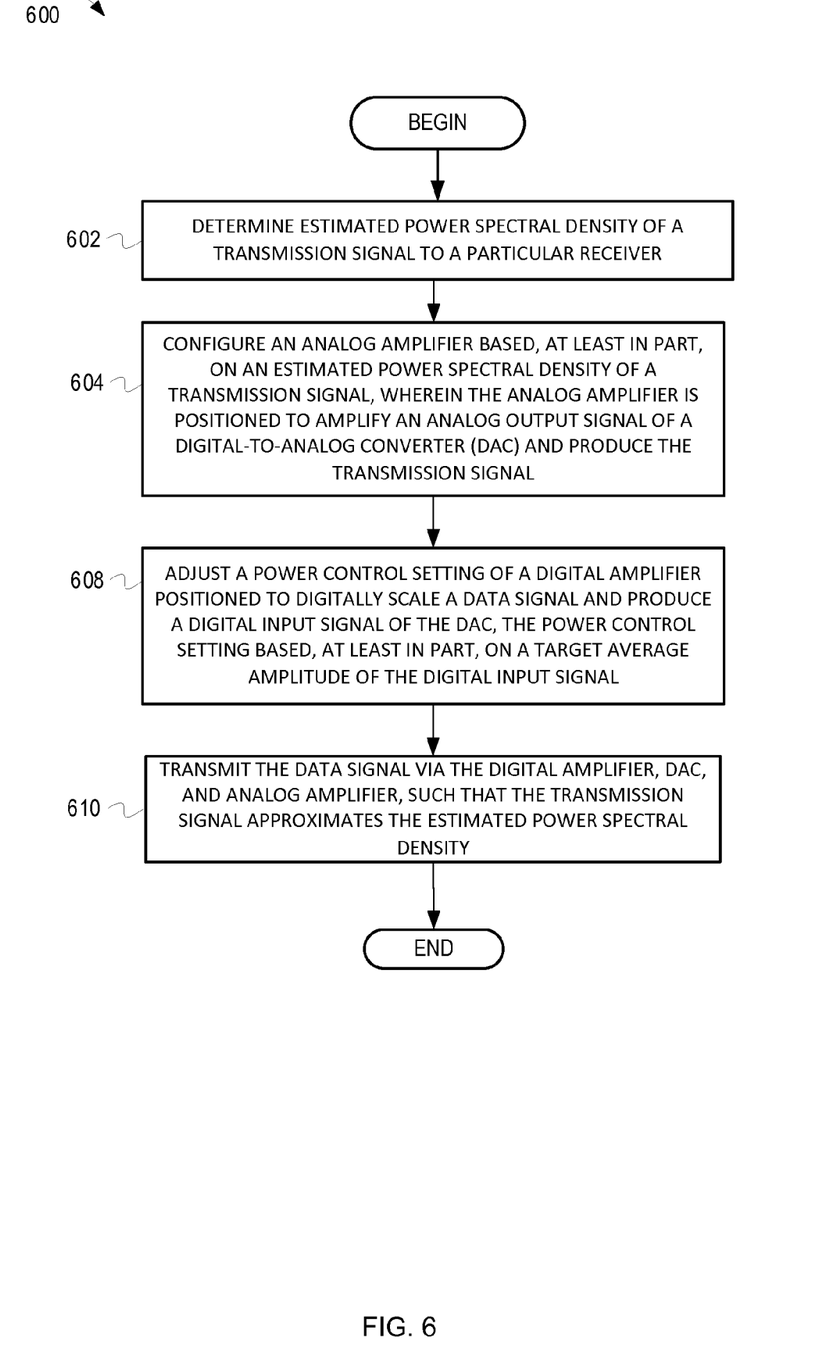
FIG. 6 is a flow diagram illustrating example operations to determine digital power control and analog gain settings in accordance with one embodiment of this disclosure.

FIG. 6 illustrates a flow diagram of example operations to determine a transmit power spectral density of a transmission signal and accordingly configure a digital amplifier and an AFE amplifier in a transmitter section to transmit the transmission signal with desired signal quality in accordance with an embodiment of the present disclosure.

At block 602, an estimate of power spectral density of a transmission signal to a particular receiver is determined. In one implementation, a DAC illumination control module (e.g., the DAC illumination control module 108) can determine the power spectral density of the transmission signal. For example, the DAC illumination control module 108 can determine the power spectral density of the transmission signal based on the input parameters (e.g., an amplitude map, a tone map, etc.) to the DAC illumination control module 108.

At block 604, an analog amplifier is configured based, at least in part, on an estimated power spectral density of a transmission signal, wherein the analog amplifier is positioned to amplify an analog output signal of a digital-to-analog converter (DAC) and produce the transmission signal. For example, in one embodiment, the DAC illumination control module 108 may configure an analog amplifier (e.g., the AFE gain control amplifier 106) with an analog gain setting. The DAC illumination control module 108 may determine the analog gain setting based on an estimated power spectral density determined at block 602. For example, the DAC illumination control module 108 computes the total transmit power from the power spectral density. Based on the output power the DAC 104 can produce, the DAC illumination control module 108 determines the analog gain setting and configures the AFE amplifier 106.

At block 608, power control settings of a digital amplifier are adjusted, wherein the digital amplifier is positioned to digitally scale a data signal and produce a digital input signal of the DAC, the power control setting based, at least in part, on a target average amplitude of the digital input signal. In one implementation, the DAC illumination control module 108 determines the power control settings of the digital amplifier (e.g., the digital power control setting for the digital amplifier 102). For example, the DAC illumination control module 108 determines the digital power control such that the output at the DAC 104 is equal to an estimated value of the root mean square voltage. The DAC illumination control module 108 sends the digital power control setting to the digital amplifier 102 which scales the amplitude of the input digital signal by a factor of the digital power control setting.

At block 610, the data signal is transmitted via the digital amplifier, DAC, and analog amplifier, such that the transmission signal approximates the estimated power spectral density. In one implementation, the data signal is transmitted from the transmitter section 100 which includes the digital amplifier 102, the DAC 104, and the AFE amplifier 106. For example, the data signal is coupled from the coupling module 114 for transmission on the communication medium. Based on the amplification by the digital power amplifier 102 and the AFE amplifier 106, the signal coupled to the transmission medium has an SNR which is approximately equal to the target SNR based on which the values of digital power control setting and the analog gain setting were computed by the DAC illumination control module 108.

Figure 7:
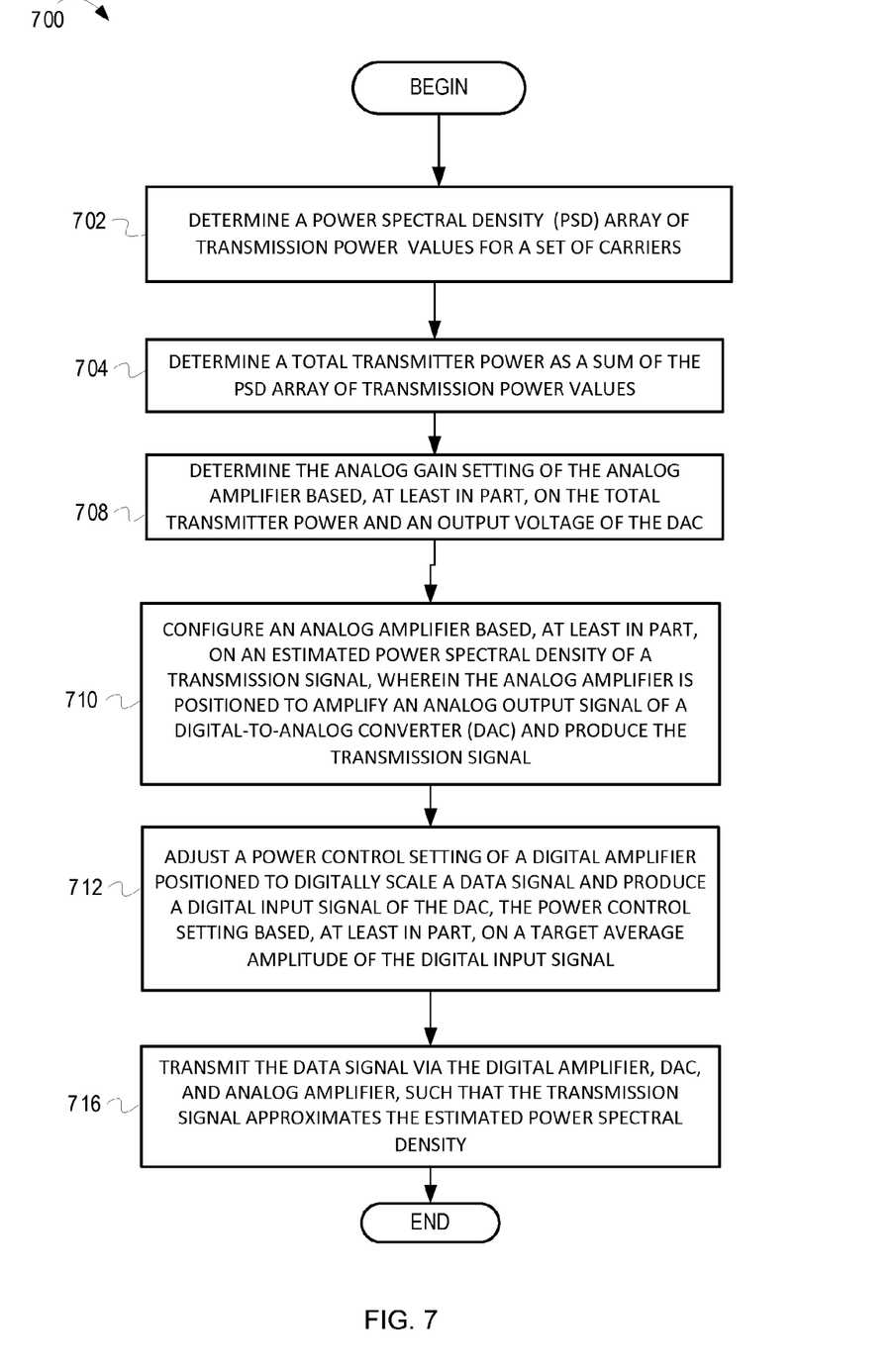
FIG. 7 is a flow diagram illustrating example operations to determine digital power control and analog gain settings based on total transmit power in accordance with one embodiment of this disclosure.

FIG. 7 illustrates a flow diagram of example operations to determine a total transmit power, determine an analog gain setting of an analog amplifier based on the total transmit power, and accordingly configure a digital amplifier and an AFE amplifier in a transmitter section to transmit a transmission signal with desired signal quality in accordance with an embodiment of the present disclosure.

At block 702, power spectral density (PSD) array of transmission power values for a set of carriers is determined. In one implementation, the DAC illumination control module 108 (as described above with reference to FIG. 1) determines the power spectral density for each of the frequency carriers of the transmission signal based on parameters such as tone map of the transmission signal, amplitude map of the transmission signal, transmission characteristics, etc.

At block 704, a total transmit power is determined as a sum of the transmission power values. In one implementation, the DAC illumination control module 108 determined the total transmit power by computing a sum of the values in the PSD array.

At block 708, an analog gain setting of the analog amplifier is determined based, at least in part, on the total transmit power and an output voltage of the DAC. In one implementation, the DAC illumination control module 108 determines the AFE gain control value. For example, the DAC illumination control module 108 computes the AFE gain control value based on the total transmit power and based on the output power the DAC 104 can output.

At block 710, an analog amplifier is configured, at least in part, on an estimated power spectral density of a transmission signal, wherein the analog amplifier is positioned to amplify an analog output signal of a digital-to-analog converter (DAC) and produce the transmission signal. In one implementation, the DAC illumination control module 108 configures the analog amplifier with the AFE gain control value determined at block 708.

At block 712, power control settings of a digital amplifier are adjusted, wherein the digital amplifier is positioned to digitally scale a data signal and produce a digital input signal of the DAC, the power control setting based, at least in part, on a target average amplitude of the digital input signal. In one implementation, the DAC illumination control module 108 determines the power control settings of the digital amplifier (e.g., the digital power control value for the digital amplifier 102). For example, the DAC illumination control module 108 determines the digital power control such that the output at the DAC 104 is equal to an estimated value of the root mean square voltage. The DAC illumination control module 108 sends the digital power control value to the digital amplifier 102 which scales the amplitude of the input digital signal by a factor of the digital power control value.

At block 716, the data signal is transmitted via the digital amplifier, DAC, and analog amplifier, such that the transmission signal approximates the estimated power spectral density. In one implementation, the data signal is transmitted from the transmitter section 100 which includes the digital amplifier 102, the DAC 104, and the AFE amplifier 106. For example, the data signal is coupled from the coupling module 114 for transmission on the communication medium. Based on the amplification by the digital power amplifier 102 and the AFE amplifier 106, the signal coupled to the transmission medium has an SNR which is approximately equal to the target SNR based on which the values of digital power control and the AFE gain control were computed by the DAC illumination control module 108.

It should be understood that FIGS. 1-7 and the operations described herein are examples meant to aid in understanding embodiments and should not be used to limit embodiments or limit scope of the claims. Embodiments may perform additional operations, fewer operations, operations in parallel or in a different order, and some operations differently.

As will be appreciated by one skilled in the art, aspects of the present inventive subject matter may be embodied as a system, method, or computer program product. Accordingly, aspects of the present inventive subject matter may take the form of an entirely hardware embodiment, a software embodiment (including firmware, resident software, microcode, etc.) or an embodiment combining software and hardware aspects that may generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more non-transitory computer readable medium(s) may be utilized, with the sole exception being a transitory, propagating signal. The non-transitory computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code embodied on a computer readable medium for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
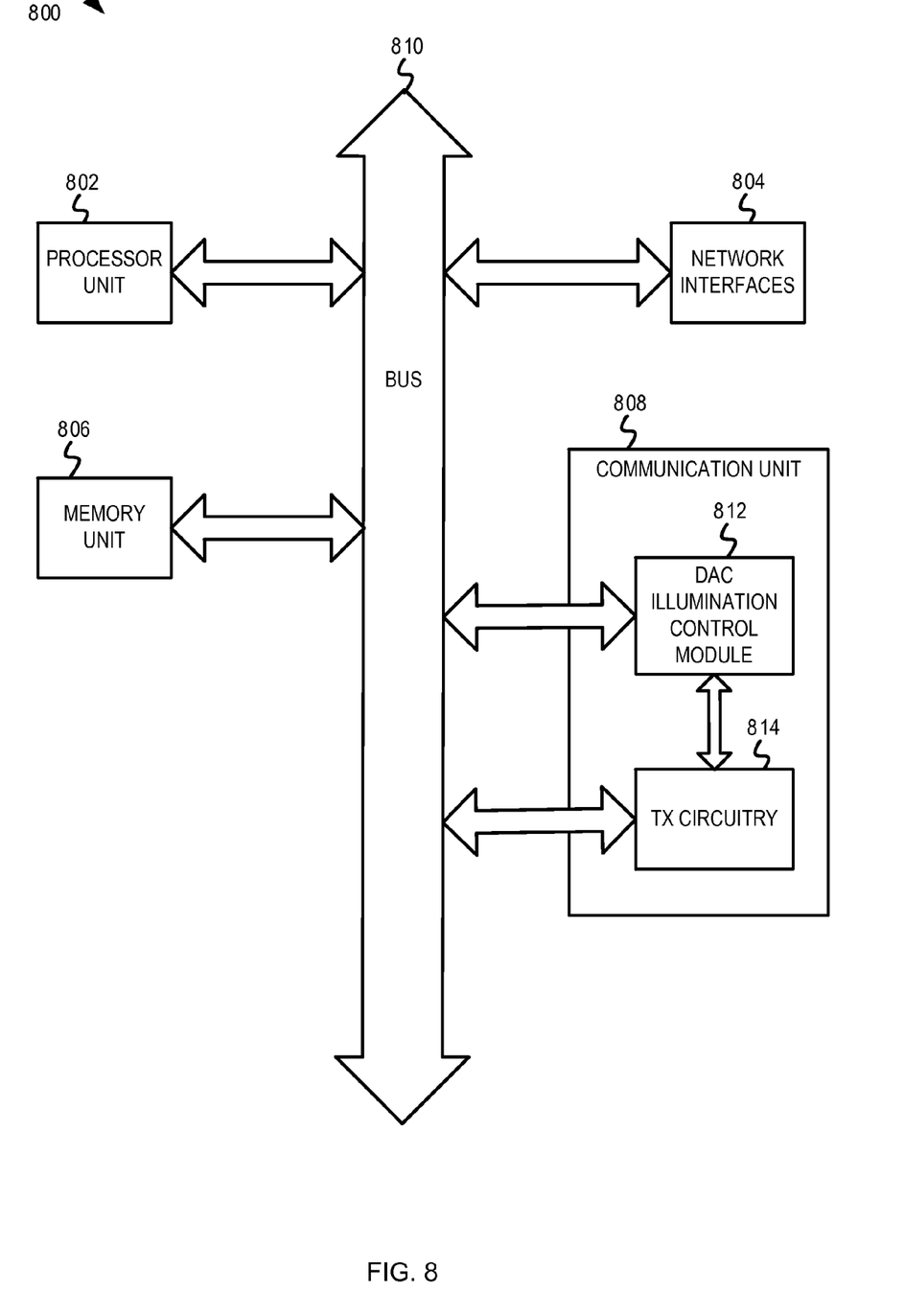
FIG. 8 is an example block diagram of one embodiment of an electronic device including a DAC illumination control module.

FIG. 8 is an example block diagram of one embodiment of an electronic device 800 including a DAC illumination control module in accordance with this disclosure. In some implementations, the electronic device 800 may be one of a laptop computer, a netbook, a mobile phone, a powerline communication device, a personal digital assistant (PDA), etc. The electronic device 800 may include a processor unit 802 (possibly including multiple processors, multiple cores, multiple nodes, and/or implementing multi-threading, etc.). The electronic device 800 may include a memory unit 806. The memory unit 806 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The electronic device 800 may also include a bus 810 (e.g., PCI, ISA, PCI-Express, HyperTransport®, InfiniBand®, NuBus, AHB, AXI, etc.), and network interfaces 804 that include at least one of a wireless network interface (e.g., a WLAN interface, a BLUETOOTH® (Bluetooth) interface, a WiMAX interface, a ZigBee® interface, a Wireless USB interface, etc.) and a wired network interface (e.g., an Ethernet interface, a powerline communication interface, etc.). In some implementations, the electronic device 800 may support multiple network interfaces—each of which is configured to couple the electronic device 800 to a different communication network.

The electronic device 800 may also include a transmission circuitry 814. For example, the transmission circuitry 814 may include components of the transmitter section as described above in FIGS. 1-7. As described above in FIGS. 1-7, the transmission circuitry 814 may include a digital amplifier and an AFE amplifier which may receive gain control values from a DAC illumination control module 812 to amplify the respective digital and analog signals input to them. As illustrated the transmission circuitry 814 may be coupled to the DAC illumination control module 812. The DAC illumination control module 812 may perform similarly to the DAC illumination control modules 108, 310, 412 described previously.

In some embodiments, the transmission circuitry 814, and the DAC illumination control module 812 may be included as part of a communication unit 808. It should be understood, that in some embodiments, the communication unit 808 may also have a dedicated processor (e.g., such as a communication unit comprising a system on a chip, or board with multiple chips, or multiple boards, in which the communication may have one or more dedicated processor or processing unit(s), in addition to the main processor 802). Any one of these functionalities may be partially (or entirely) implemented in hardware and/or on the processor unit 802. For example, the functionality may be implemented with an application specific integrated circuit, in logic implemented in the processor unit 802, in a co-processor on a peripheral device or card, etc. Further, realizations may include fewer or additional components not illustrated in FIG. 8 (e.g., video cards, audio cards, additional network interfaces, peripheral devices, etc.). The processor unit 802, the memory unit 806, and the network interfaces 806 are coupled to the bus 810. Although illustrated as being coupled to the bus 810, the memory unit 806 may be coupled to the processor unit 802.

While the embodiments are described with reference to various implementations and exploitations, it will be understood that these embodiments are illustrative and that the scope of the inventive subject matter is not limited to them. In general, techniques for dynamically controlling illumination of a DAC and ensuring high signal quality at the output of a transmitter as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method, comprising:
digitally scaling, at a digital amplifier, a data signal to generate a digital input signal;
generating, at a digital-to-analog converter (DAC), an analog output signal based, at least in part, on the digital input signal;
amplifying, at an analog amplifier, the analog output signal to generate a transmission signal based, at least in part, on an estimated power spectral density of the transmission signal; and
adjusting a power control setting of the digital amplifier based, at least in part, on a target average amplitude of the digital input signal, wherein the target average amplitude of the digital input signal is based, at least in part, on an analog gain setting of the analog amplifier.

2. The method of claim 1, further comprising:
transmitting the data signal via the digital amplifier, the DAC, and the analog amplifier, such that the transmission signal approximates the estimated power spectral density.

3. The method of claim 1, wherein the target average amplitude of the digital input signal is based, at least in part, on a target DAC illumination that is optimized for a particular transmitter.

4. The method of claim 1, wherein power gain of the transmission signal is controlled primarily by the analog amplifier, and wherein the power control setting of the digital amplifier is adjusted to reduce DAC quantization.

5. The method of claim 1, further comprising:
determining an analog gain setting of the analog amplifier based, at least in part, on a predetermined output voltage of the DAC; and
configuring the analog amplifier based, at least in part, on the analog gain setting.

6. The method of claim 5, wherein adjusting the power control setting is performed after configuring the analog amplifier, and wherein the power control setting is further based, at least in part, on the analog gain setting of the analog amplifier.

7. The method of claim 5, wherein the predetermined output voltage of the DAC is defined as a target root mean square voltage range.

8. The method of claim 5, wherein the predetermined output voltage of the DAC is associated with a predetermined input digital amplitude of the DAC.

9. The method of claim 8, wherein adjusting the power control setting includes determining a scale factor to multiply the data signal to produce the digital input signal having the predetermined input digital amplitude.

10. The method of claim 1, further comprising:
determining the estimated power spectral density; and
configuring the analog amplifier based, at least in part, on the estimated power spectral density.

11. The method of claim 10, wherein the transmission signal comprises a multicarrier signal, and wherein the estimated power spectral density is based, at least in part, on relative tone amplitudes of a plurality of frequencies in the multicarrier signal.

12. The method of claim 10, wherein the estimated power spectral density is based, at least in part, on a tone map associated with the transmission signal.

13. The method of claim 10, wherein determining the estimated power spectral density includes determining at least one member of the group consisting of pulse shaping, power back-off, analog pre-distortion, and coupler power roll-off.

14. The method of claim 10, wherein determining the estimated power spectral density comprises:
determining a power spectral density (PSD) array of transmission power values for a set of carriers;
determining a total transmit power as a sum of the PSD array of transmission power values; and
determining the analog gain setting of the analog amplifier based, at least in part, on the total transmit power and an output voltage of the DAC.

15. The method of claim 1, wherein said digitally scaling, generating, amplifying, and adjusting are responsive to a particular recipient of the data signal.

16. The method of claim 1, wherein adjusting the power control setting comprises:
determining the power control setting as a ratio between the target average amplitude of the digital input signal and an estimated amplitude of the digital input signal, wherein the estimated amplitude of the digital input signal is based, at least in part, on the estimated power spectral density.

17. The method of claim 1, wherein said adjusting is performed independently for each of two or more transmitters in a multi-transmitter device.

18. The method of claim 1, further comprising:
determining, at a media access control (MAC) layer of a device, the analog gain setting of the analog amplifier and the power control setting of the digital amplifier.

19. An apparatus comprising:
a digital amplifier configured to digitally scale a data signal based, at least in part, on a power control setting to generate a digital input signal;
a digital to analog converter (DAC) configured to receive the digital input signal and to generate an analog output signal;
an analog amplifier configured to receive the analog output signal to generate a transmission signal; and
a DAC illumination control module configured to:
determine an analog gain setting of the analog amplifier based, at least in part, on an estimated power spectral density of the analog output signal, and
determine the power control setting based, at least in part, on a target average amplitude of the digital input signal, wherein the target average amplitude of the digital input signal is based, at least in part, on the analog gain setting of the analog amplifier.

20. The apparatus of claim 19, wherein the digital amplifier comprises a variable-gain pre-amplifier.

21. The apparatus of claim 19, wherein the target average amplitude of the digital input signal is based, at least in part, on a target DAC illumination.

22. The apparatus of claim 19, wherein the analog gain setting of the analog amplifier is based, at least in part, on a predetermined output voltage of the DAC.

23. The apparatus of claim 19, wherein the DAC illumination control module is configured to determine the analog gain setting prior to determining the power control setting.

24. The apparatus of claim 19, wherein the DAC illumination control module is configured to determine at least one member of the group consisting of pulse shaping, power back-off, analog pre-distortion, and coupler power roll-off.

25. A non-transitory computer readable medium storing instructions which, when executed by one or more processors of a device, cause the device to:
- digitally scale, at a digital amplifier, a data signal to generate a digital input signal;
- generate, at a digital-to-analog converter (DAC), an analog output signal based, at least in part, on the digital input signal;
- amplify, at an analog amplifier, the analog output signal to generate a transmission signal based, at least in part, on an estimated power spectral density of the transmission signal; and
- adjust a power control setting of the digital amplifier based, at least in part, on a target average amplitude of the digital input signal, wherein the target average amplitude of the digital input signal is based, at least in part, on an analog gain setting of the analog amplifier.

26. The non-transitory computer readable medium of claim 25, further storing instructions which, when executed by the one or more processors of the device, cause the device to: determine the estimated power spectral density prior to configuring the analog amplifier.

27. A system comprising:
- means for digitally scaling, at a digital amplifier, a data signal to generate a digital input signal;
- means for generating, at a digital-to-analog converter (DAC), an analog output signal based, at least in part, on the digital input signal;
- means for amplifying an analog amplifier to generate a transmission signal based, at least in part, on an estimated power spectral density of the transmission signal; and
- means for adjusting a power control setting of the digital amplifier based, at least in part, on a target average amplitude of the digital input signal, wherein the target average amplitude of the digital input signal is based, at least in part, on an analog gain setting of the analog amplifier.

* * * * *